United States Patent
Yamaoka

(10) Patent No.: US 8,307,325 B2
(45) Date of Patent: Nov. 6, 2012

(54) METHOD OF SEMICONDUCTOR INTEGRATED CIRCUIT AND COMPUTER READABLE MEDIUM

(75) Inventor: Hiroaki Yamaoka, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/044,025

(22) Filed: Mar. 9, 2011

(65) Prior Publication Data

US 2012/0047480 A1  Feb. 23, 2012

(30) Foreign Application Priority Data

Aug. 17, 2010 (JP) ................................. 2010-182389

(51) Int. Cl.
*G06F 17/50* (2006.01)
*G06F 9/455* (2006.01)

(52) U.S. Cl. ........ 716/139; 716/126; 716/129; 716/130; 716/131

(58) Field of Classification Search .................. 716/126, 716/129–131, 139
See application file for complete search history.

(56) References Cited

U.S. PATENT DOCUMENTS

| 7,007,248 | B2 * | 2/2006 | Blinne et al. | 716/102 |
| 7,034,384 | B2 * | 4/2006 | Tsai | 257/678 |
| 8,060,853 | B2 * | 11/2011 | Orita | 716/139 |

FOREIGN PATENT DOCUMENTS

JP  2000-252360  9/2000

* cited by examiner

*Primary Examiner* — Nghia Doan
(74) *Attorney, Agent, or Firm* — Sprinkle IP Law Group

(57) ABSTRACT

According to one embodiment, a design method of a semiconductor integrated circuit is a design method of a semiconductor integrated circuit including a first wiring layer, a second wiring layer formed on the first wiring layer, and a third wiring layer formed on the second wiring layer. This method includes a process in which plural spare wirings are arranged on the second wiring layer along a first direction, and plural spare wirings are arranged on the third wiring layer in a second direction orthogonal to the first direction. The method also includes a process of arranging a cell on the first wiring layer after the arrangement of the spare wirings, a process of arranging a signal wiring on at least any one of the first to the third wiring layers after the arrangement of the cell, and a process of performing an engineering change order of the wiring by using the spare wirings.

14 Claims, 15 Drawing Sheets

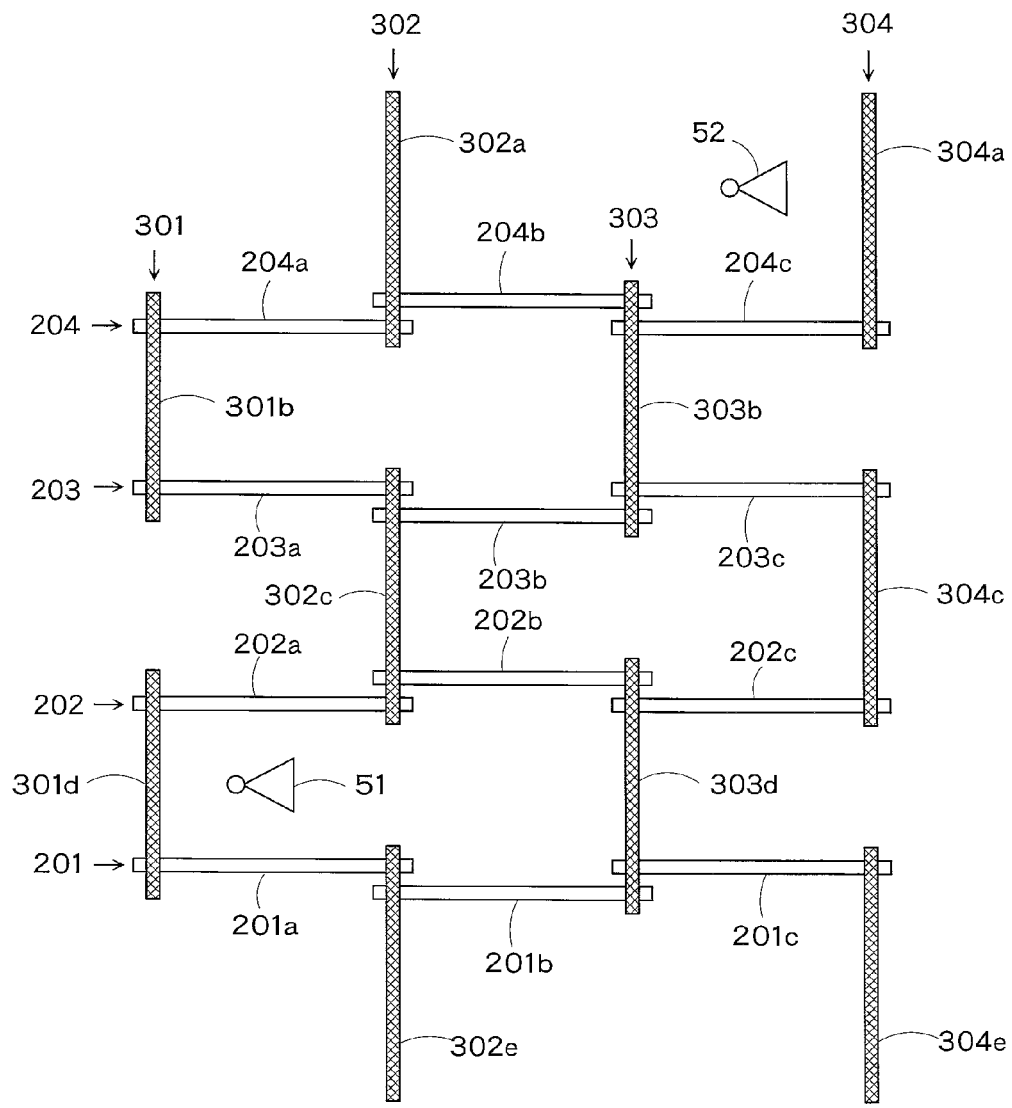
F I G. 5

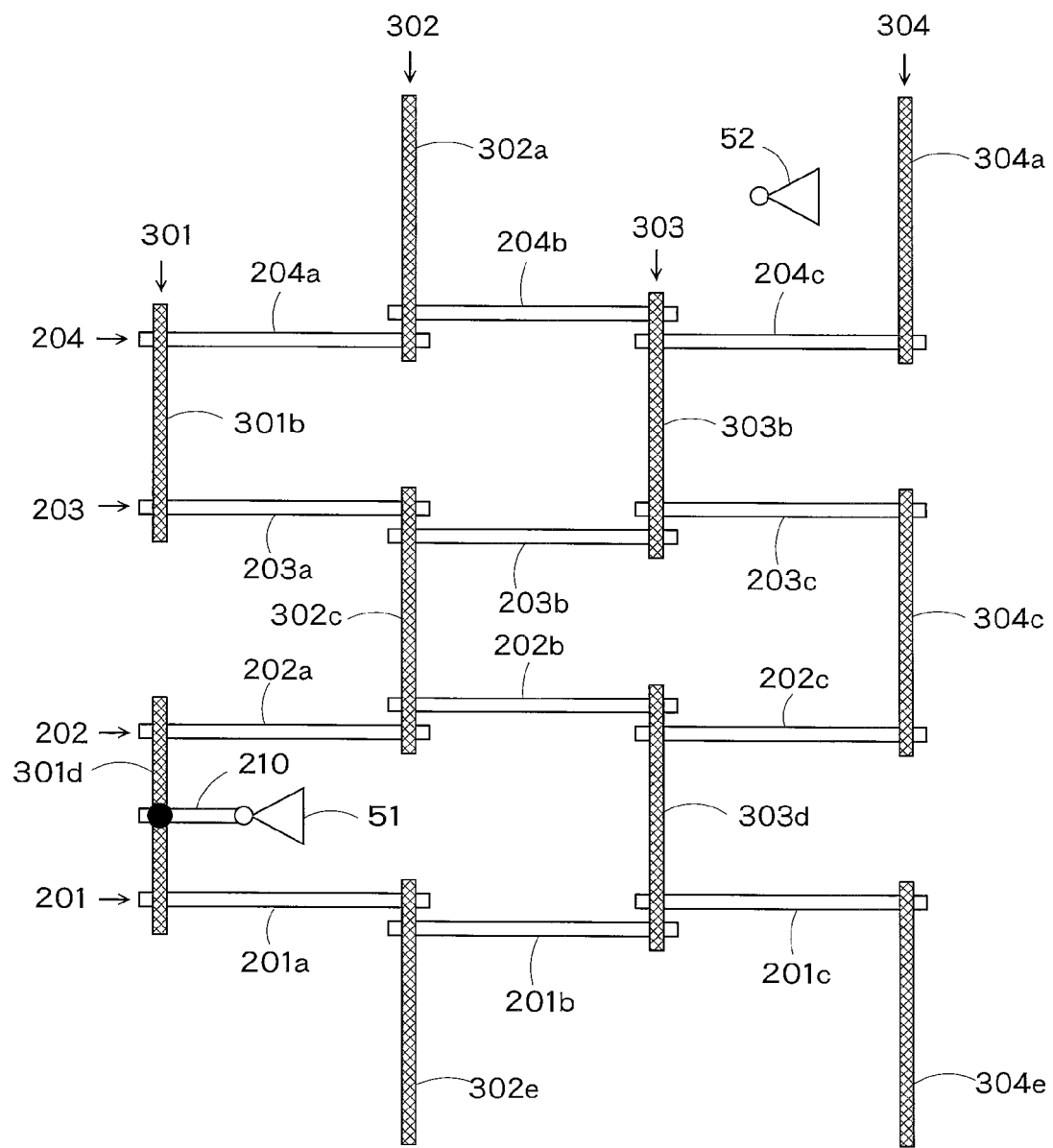
F I G. 6

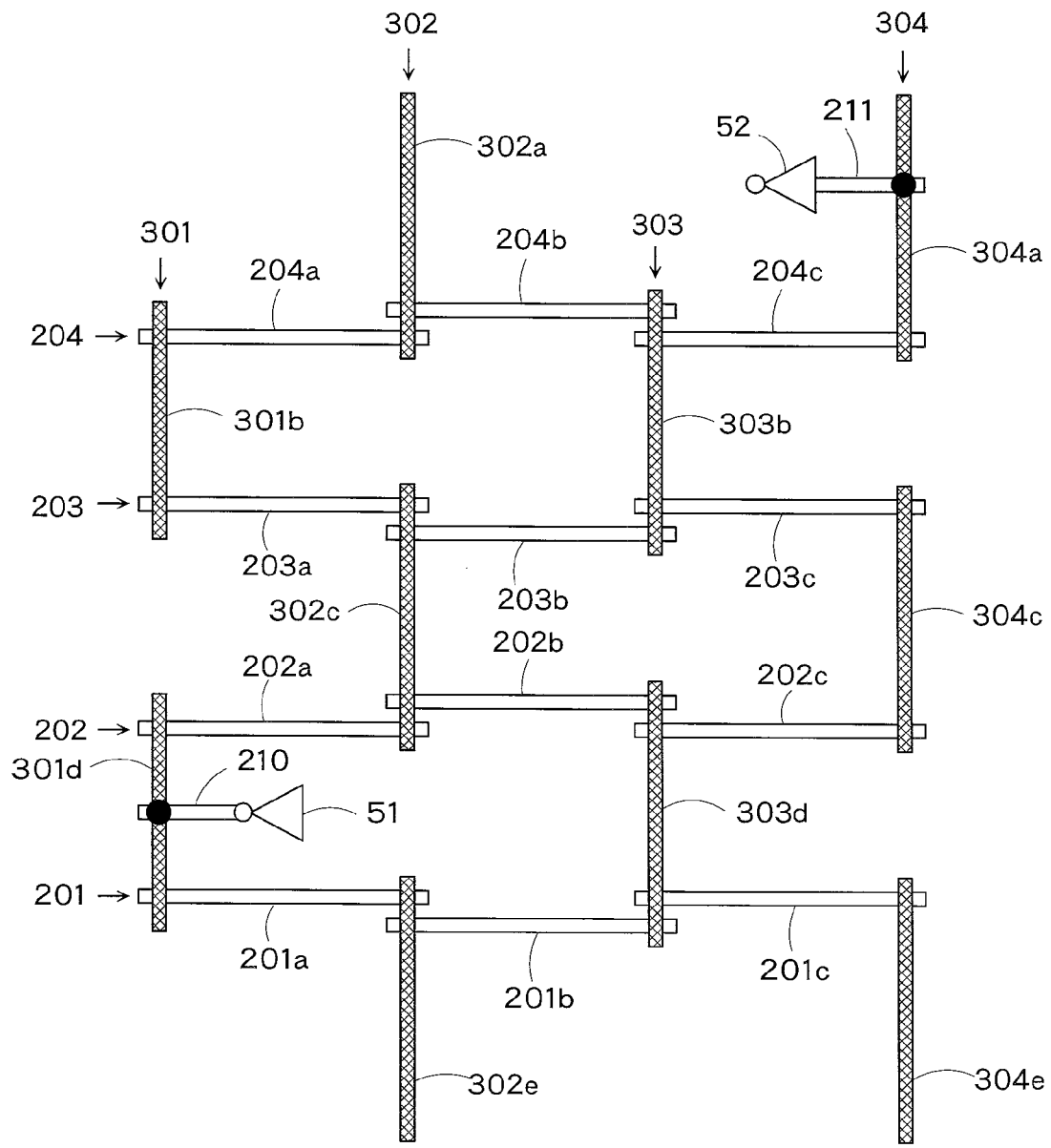
F I G. 7

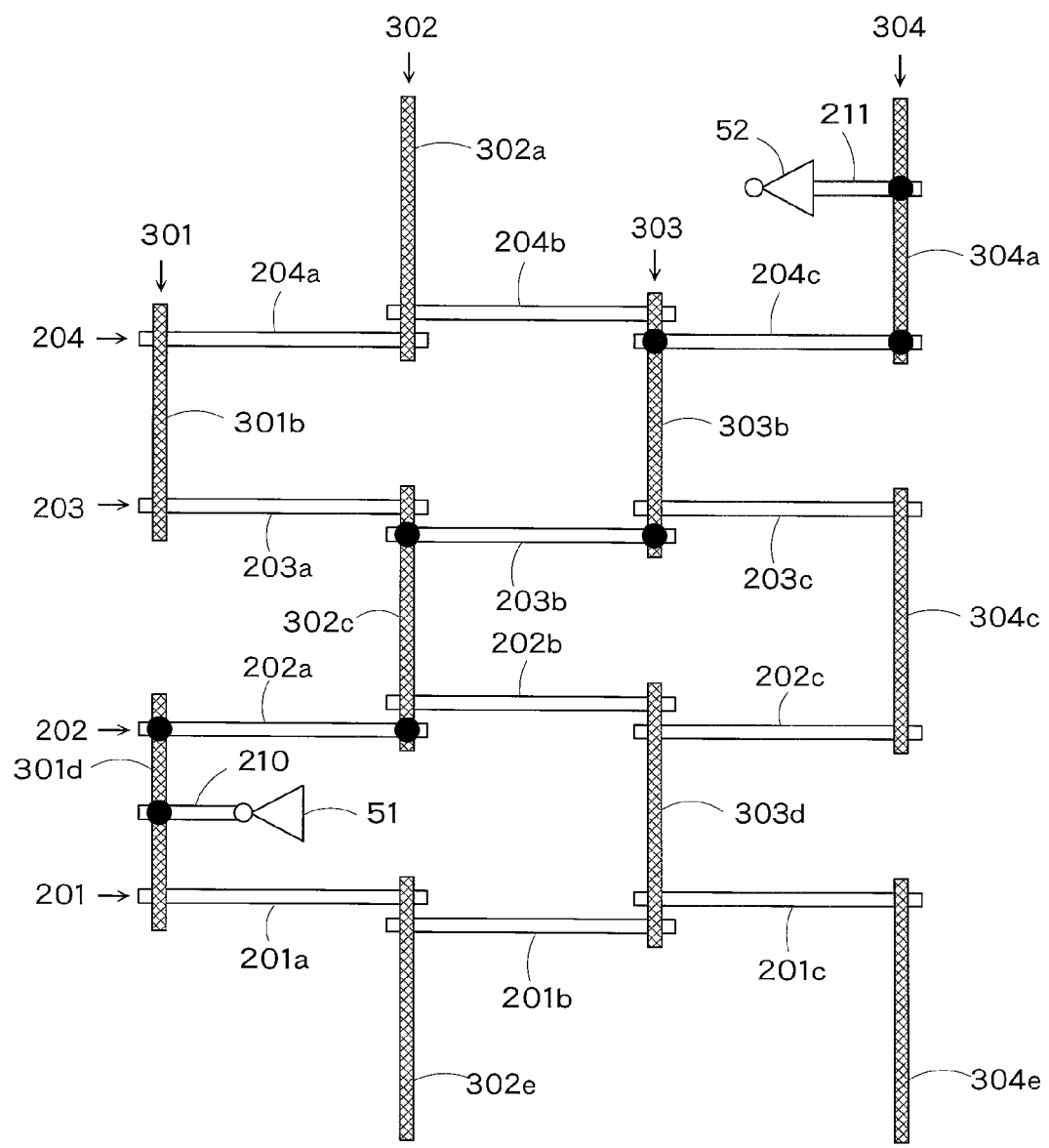
F I G. 8

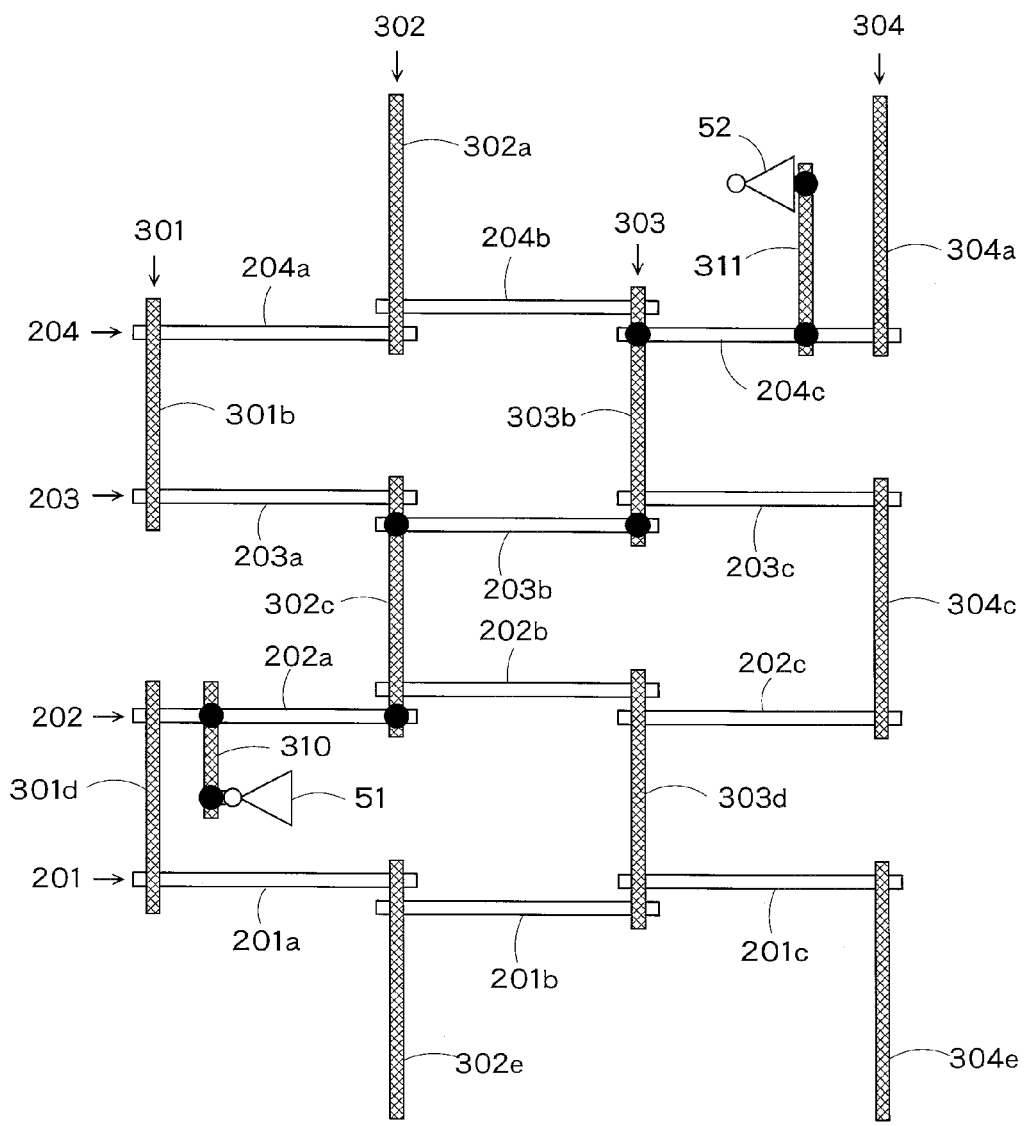
F I G. 9

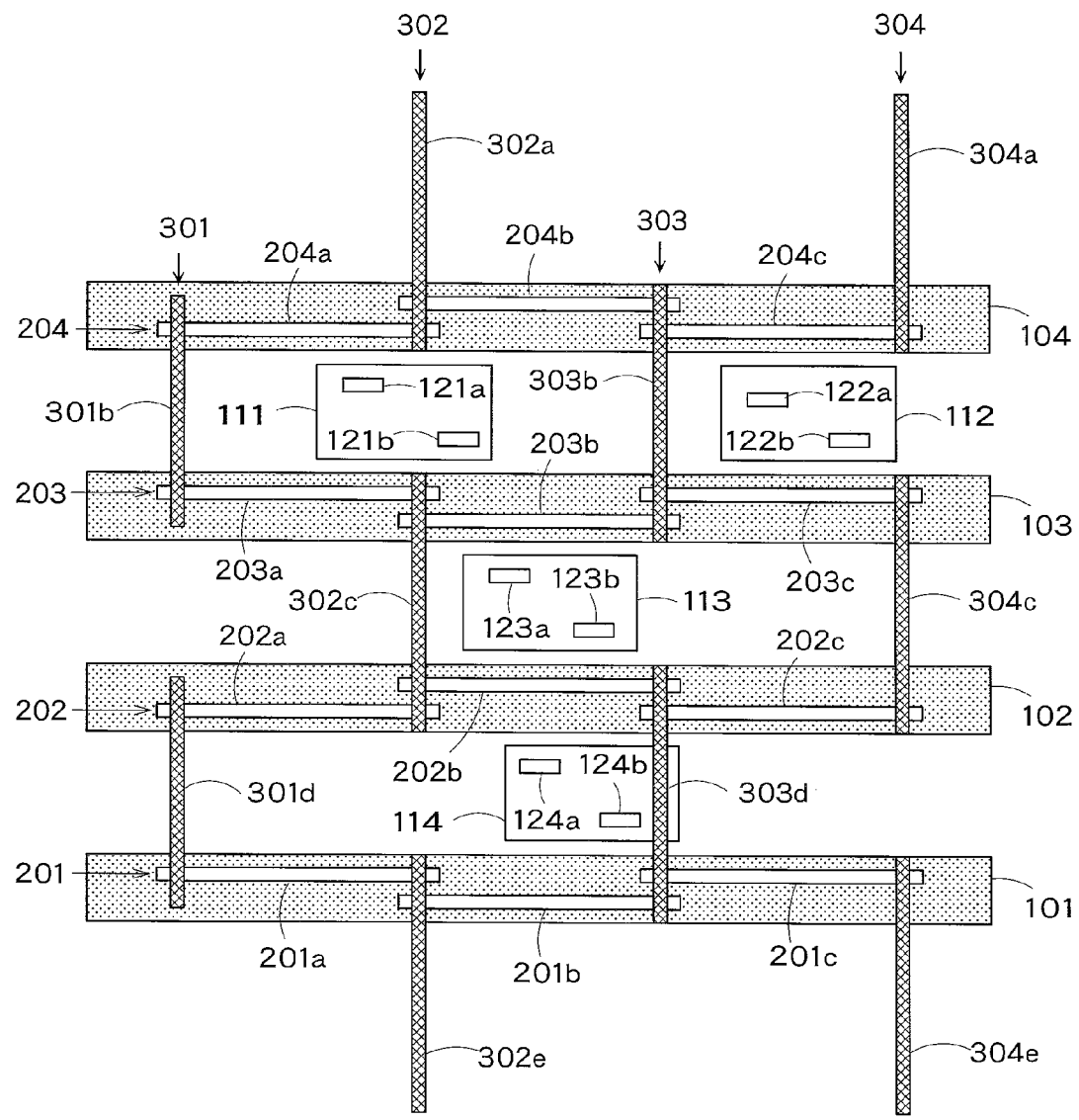
F I G. 10

METHOD OF SEMICONDUCTOR INTEGRATED CIRCUIT AND COMPUTER READABLE MEDIUM

CROSS REFERENCE TO RELATED APPLICATIONS

This application is based upon and claims the benefit of priority from the prior Japanese Patent Application No. 2010-182389, filed on Aug. 17, 2010, the entire contents of which are incorporated herein by reference.

FIELD

Embodiments described herein relate generally to a design method of a semiconductor integrated circuit and a computer readable medium.

BACKGROUND

In a process of designing a semiconductor integrated circuit, an Engineering Change Order (ECO) may be executed to wirings because of a logic change. Conventionally, a dummy wiring is arranged after a basic cell and a signal wiring are arranged in a chip.

However, in a conventional automatic layout and wiring technique, the layout of the basic cell and the signal wiring is more efficiently performed, in other words, the layout described above is performed in order to reduce an ineffective region as much as possible. Therefore, the number of wirings and the wiring spot of the dummy wiring are limited. Accordingly, in the ECO of the wiring using the dummy wiring, an ECO might be caused in plural wiring layers, or a layout has to be re-designed from the beginning since the ECO using the dummy wiring cannot be executed. When an ECO is needed after the fabrication of a mask, the execution of the ECO for plural wiring layers leads to the increase in a number of corrected masks, with the result that a cost might be increased. When the layout is re-designed from the beginning, the time taken for the layout design is increased, which entails a problem of a prolonged design period and an increase in a design cost.

BRIEF DESCRIPTION OF THE DRAWINGS

FIG. 5 is a view illustrating one example of an ECO using the spare wirings;

FIG. 6 is a view illustrating one example of an ECO using the spare wirings;

FIG. 7 is a view illustrating one example of an ECO using the spare wirings;

FIG. 8 is a view illustrating one example of an ECO using the spare wirings;

FIG. 9 is a view illustrating one example of an ECO using the spare wirings;

FIG. 10 is a view illustrating a layout example of spare wirings according to a second embodiment;

DETAILED DESCRIPTION

According to one embodiment, a design method of a semiconductor integrated circuit is a design method of a semiconductor integrated circuit including a first wiring layer, a second wiring layer formed on the first wiring layer, and a third wiring layer formed on the second wiring layer. This method includes a process in which plural spare wirings are arranged on the second wiring layer along a first direction, and plural spare wirings are arranged on the third wiring layer in a second direction orthogonal to the first direction. The method also includes a process of arranging a cell on the first wiring layer after the arrangement of the spare wirings, a process of arranging a signal wiring on at least any one of the first to the third wiring layers after the arrangement of the cell, and a process of performing an engineering change order of the wiring by using the spare wirings.

Hereafter, the present invention will be described more specifically with reference to the drawings.

First Embodiment

Figure 1:
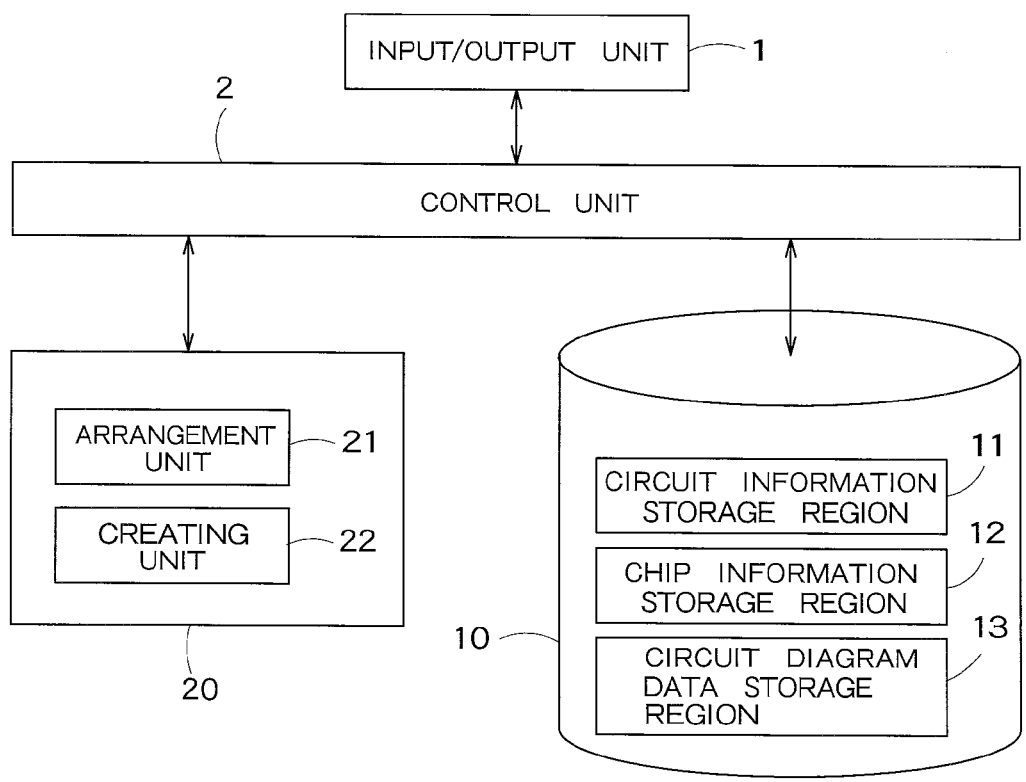
FIG. 1 is a schematic diagram illustrating a configuration of a design apparatus of a semiconductor integrated circuit according to a first embodiment.

FIG. 1 illustrates a schematic configuration of a design apparatus of a semiconductor integrated circuit according to a first embodiment of the present invention. A design apparatus includes an input/output unit 1, a control unit 2, a storage unit 10, and an operation unit 20 for designing a semiconductor integrated circuit having plural wiring layers. The input/output unit 1 performs input and output of data. The control unit 2 performs a data-transfer control among the input/output unit 1, the storage unit 10, and the operation unit 20.

The storage unit 10 includes a circuit information storage region 11, a chip information storage region 12, and a circuit diagram data storage region 13.

The circuit information storage region 11 stores circuit design information such as cell information of a standard cell (functional block) arranged on a chip and connection information (net list) of each cell. The chip information storage region 12 stores information about a chip size on which the cell is arranged. The circuit diagram data storage region 13 stores circuit diagram data that is information of the chip on which the cell is arranged.

The operation unit 20 includes an arrangement unit 21 and a creating unit 22.

The arrangement unit 21 arranges a spare wiring (preliminary wiring), a signal wiring, and the cell based upon the circuit design information and the chip information. The method of arranging the spare wiring will be described later.

The arrangement unit 21 executes a Clock Tree Synthesis (CTS) in which a clock buffer is inserted into a clock wiring network, which is for transferring a clock signal, the clock buffer being laid out with a load balance being adjusted like a tree.

The arrangement unit 21 corrects the wiring (rearranges the wiring) due to the engineering change order (ECO) by using the spare wiring. The method of correcting the wiring will be described later.

The creating unit 22 creates circuit diagram data based upon the arrangement of the spare wiring, the cell, and the signal wiring by the arrangement unit 21. The creating unit 22 writes the circuit diagram data to the circuit diagram data storage region 13. An exposure mask corresponding to each wiring layer is produced based upon the circuit diagram data.

Figure 2:
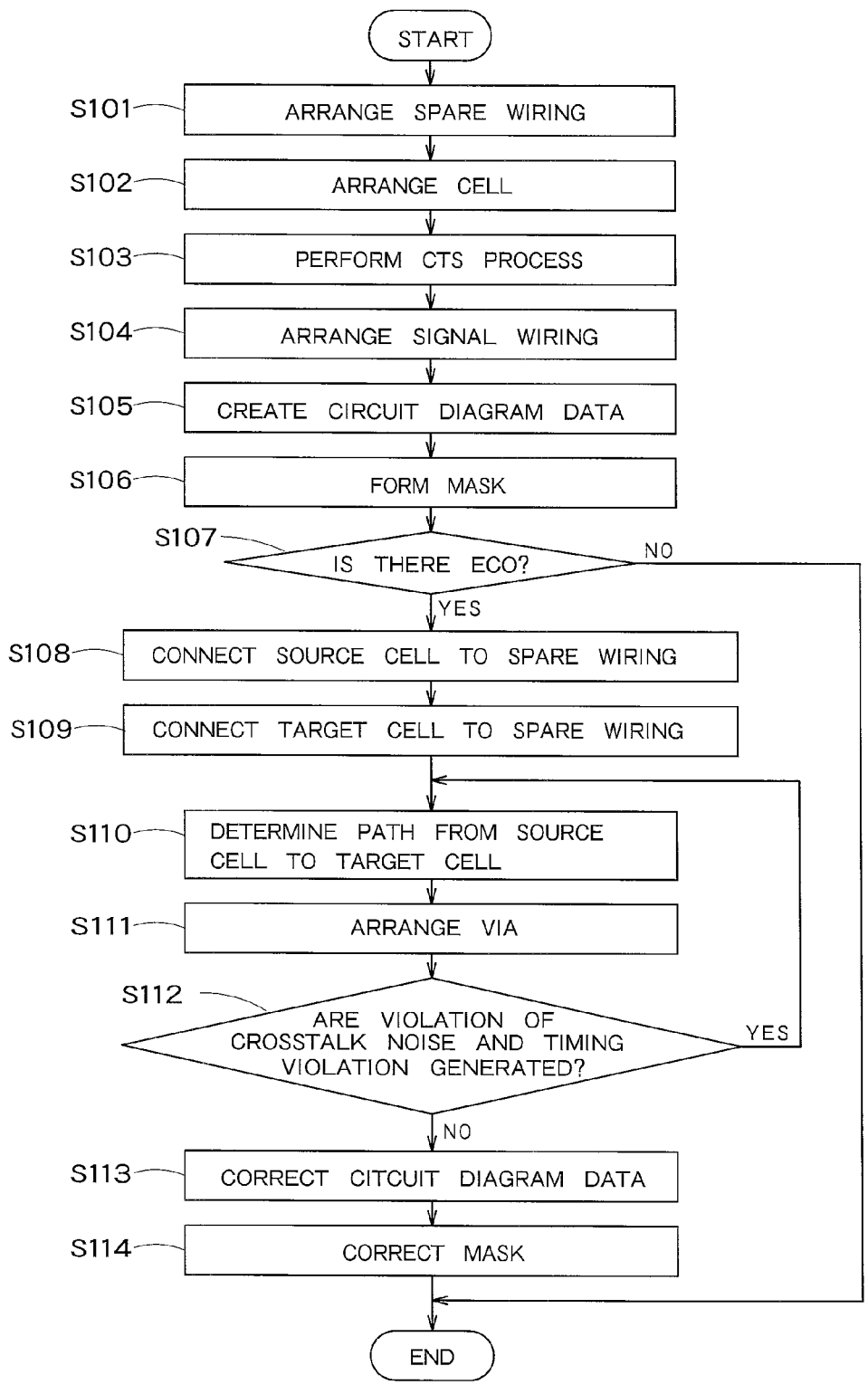
FIG. 2 is a flowchart illustrating a design method of the semiconductor integrated circuit according to the first embodiment.

Next, the design method of the semiconductor integrated circuit according to the present embodiment will be described with reference to the flowchart illustrated in FIG. 2. FIG. 2 is a flowchart illustrating a series of design processes of the circuit design using the design method according to the present embodiment.

Figure 3:
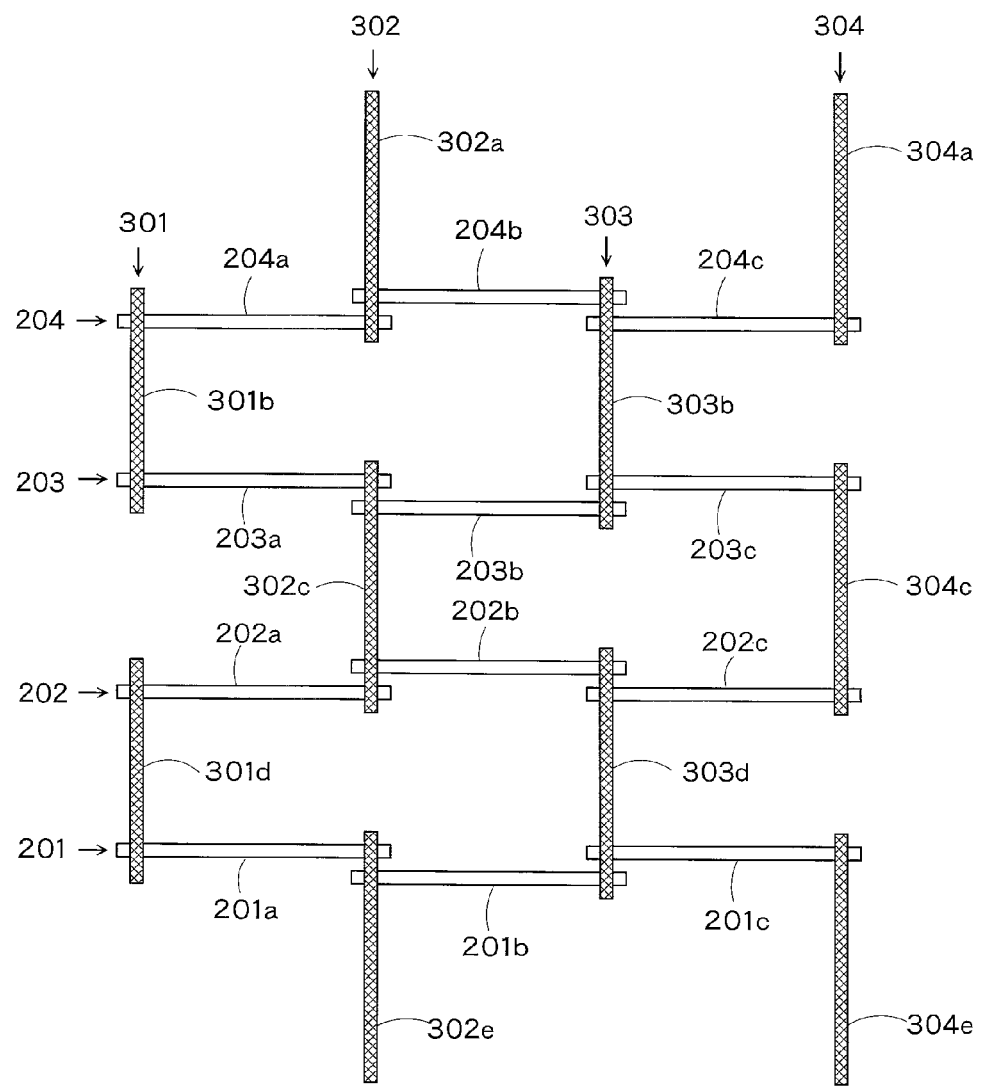
FIG. 3 is a top view illustrating a layout example of spare wirings.
Figure 4:
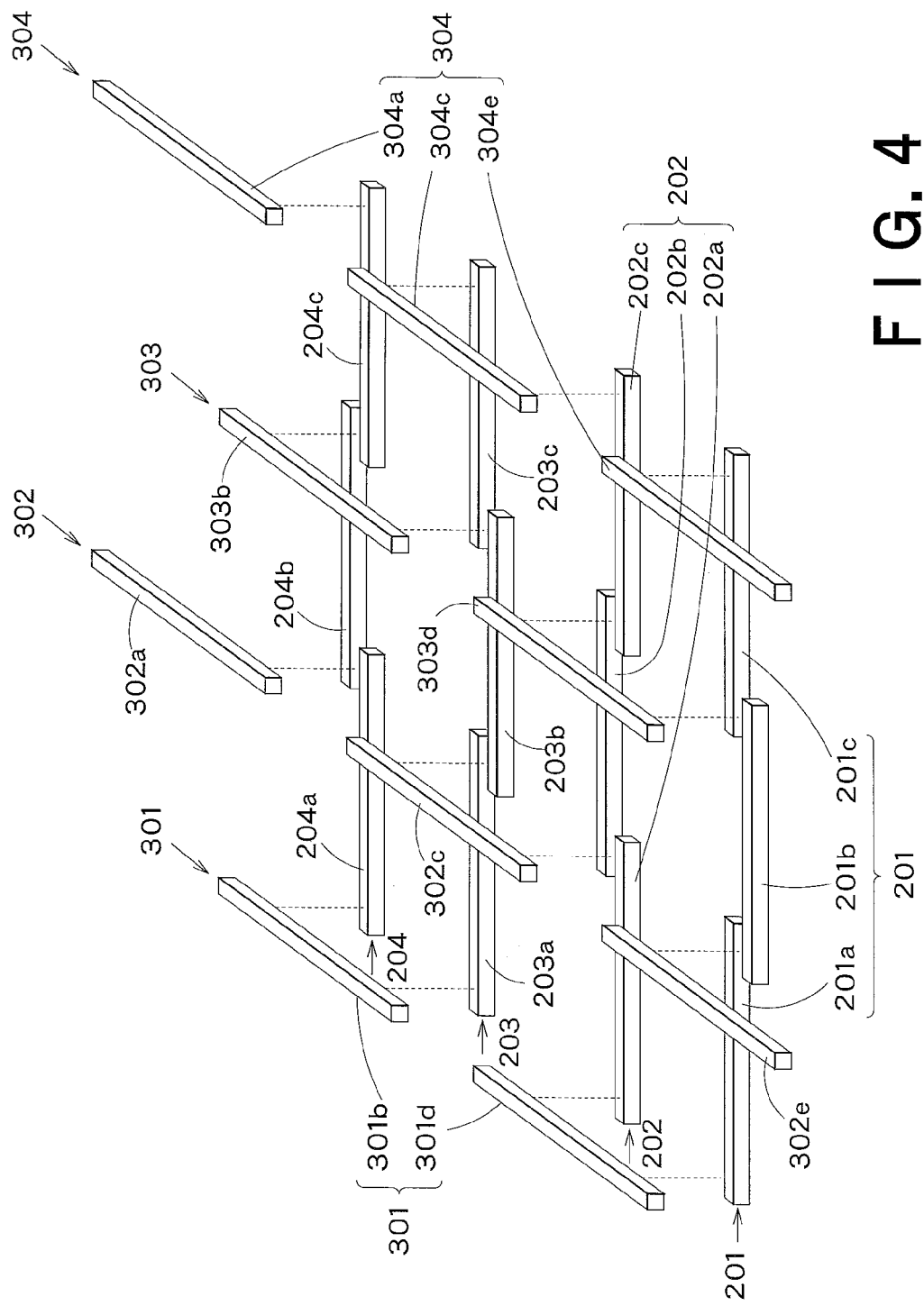
FIG. 4 is a perspective view illustrating the layout example of the spare wirings.

(Step S101) The arrangement unit 21 arranges the spare wiring based upon the circuit design information and the chip information. FIGS. 3 and 4 illustrate an arrangement example of the spare wiring. FIG. 3 is a top view of the spare wiring, and FIG. 4 is a perspective view of the spare wiring. In this example, the spare wiring is arranged on a second metal wiring layer on a first metal wiring layer having a power wire and the cell arranged thereon, and on a third metal wiring layer on the second metal wiring layer.

In the description below, the first metal wiring layer, the second metal wiring layer, and the third metal wiring layer are referred to as M1 layer, M2 layer, and M3 layer, respectively. The spare wirings arranged on the M2 layer and the M3 layer are referred to as an M2 spare wiring and M3 spare wiring, respectively. FIGS. 2 and 3 illustrate the spare wirings on the wiring layers, but unillustrated wirings (normal wirings) are arranged between the spare wirings. The normal wirings are arranged so as to be parallel to the spare wirings on the M1 layer, M2 layer, and M3 layer, respectively.

As illustrated in FIGS. 3 and 4, M2 spare wirings 201 to 204 are arranged parallel along a first direction (lateral direction in FIG. 3). M3 spare wirings 301 to 304 are arranged parallel along a second direction (vertical direction in FIG. 3) orthogonal to the first direction.

The M2 spare wirings 201 to 204 will firstly be described.

The M2 spare wiring 201 includes M2 spare wirings 201a, 201b, and 201c that are arranged substantially linearly. More specifically, the M2 spare wiring 201a and the M2 spare wiring 201c are arranged on the same wiring track, and the M2 spare wiring 201b is arranged on a wiring track adjacent to the wiring track on which the M2 spare wirings 201a and 201c are arranged. One end of the M2 spare wiring 201a is adjacent to one end of the M2 spare wiring 201b. The other end of the M2 spare wiring 201b is adjacent to one end of the M2 spare wiring 201c. As described above, the spare wiring on the M2 layer includes the spare wirings 201a and 201c discontinuously arranged on the first track in the first direction, and the spare wiring 201b arranged parallel on the discontinuous part of the spare wirings 201a and 201c on the second track that is adjacent to the first track. One end of the discontinuous part of the spare wiring 201a and one end of the spare wiring 201b at the side of the spare wiring 201a are adjacent to each other so as to be partly overlapped with each other with respect to the second direction. One end of the discontinuous part of the spare wiring 201c and one end of the spare wiring 201b at the side of the spare wiring 201c are adjacent to each other so as to be partly overlapped with each other with respect to the second direction.

The M2 spare wirings 202 to 204 have the configuration same as that of the M2 spare wiring 201.

The distance between the M2 spare wiring 201 and the M2 spare wiring 202 is determined, for example, based upon the distance between the power wires mounted on the M1 layer. Similarly, the distance between the M2 spare wiring 202 and the M2 spare wiring 203, and the distance between the M2 spare wiring 203 and the M2 spare wiring 204 are also determined based upon the distance between the power wires mounted on the M1 layer.

Next, the M3 spare wirings 301 to 304 will be descried.

The distance between the M3 spare wiring 301 and the M3 spare wiring 302 are substantially equal to the length of the M2 spare wiring 201a, 202a, 203a, and 204a. The distance between the M3 spare wiring 302 and the M3 spare wiring 303 are substantially equal to the length of the M2 spare wiring 201b, 202b, 203b, and 204b. The distance between the M3 spare wiring 303 and the M3 spare wiring 304 are substantially equal to the length of the M2 spare wiring 201c, 202c, 203c, and 204c.

The M3 spare wiring 301 includes M3 spare wirings 301b and 301d arranged on the same wiring track. The M3 spare wiring 302 includes M3 spare wirings 302a, 302c, and 302e arranged on the same wiring track. The M3 spare wiring 303 has the configuration same as that of the M3 spare wiring 301, and the M3 spare wiring 304 has the configuration same as that of the M3 spare wiring 302.

One end of the M3 spare wiring 301b is located above one end of the M2 spare wiring 204a, and the other end of the M3 spare wiring 301b is located above one end of the M2 spare wiring 203a. Therefore, the M3 spare wiring 301b can be via-connected to the M2 spare wirings 203a and 204a, respectively.

One end of the M3 spare wiring 302c is located above the other end of the M2 spare wiring 203a and one end of the M2 spare wiring 203b, and the other end of the M3 spare wiring 302c is located above one ends of the M2 spare wirings 202a and 202b. Therefore, the M3 spare wiring 302c can be via-connected to the M2 spare wirings 202a, 202b, 203a, and 203b, respectively.

As described above, the spare wiring on the M3 layer includes the spare wirings 302a, 302c, and 302e discontinuously arranged on the first track in the second direction. The spare wiring 302a is arranged such that one end thereof is overlapped with the spare wiring 204a and the spare wiring 204b at the region where the spare wiring 204a and the spare wiring 204b are overlapped. The spare wiring 302c is arranged such that one end thereof is overlapped with the spare wiring 203a and the spare wiring 203b at the region where the spare wiring 203a and the spare wiring 203b are overlapped. The spare wiring 302c is also arranged such that the other end thereof is overlapped with the spare wiring 202a and the spare wiring 202b at the region where the spare wiring 202a and the spare wiring 202b are overlapped. The spare wirings illustrated in FIG. 3 are arranged on the whole chip surface, to which the circuit design is executed, in accordance with the regularity illustrated in FIG. 3. The spare wirings may be arranged on some region, e.g., on only the region where the design method according to the present embodiment is applied, not arranged on the whole chip surface.

As described above, in step S101, some normal wirings are secured as the spare wirings with the pattern illustrated in FIG. 3 on each of the M2 layer and the M3 layer.

(Step S102) The arrangement unit 21 arranges the cells on the M1 layer based upon the circuit design information and the chip information. In this case, a layout of a virtual schematic wiring may be executed.

(Step S103) The arrangement unit 21 performs a CTS process. Thus, a clock wiring network is arranged.

(Step S104) The arrangement unit 21 arranges a signal wiring, which transfers data signal, on at least any one of the M1 layer, the M2 layer, and the M3 layer. Thus, a detailed wiring is arranged.

(Step S105) The creating unit 22 creates the circuit diagram data, and writes the same into the circuit diagram data storage region 13.

According to the processes in steps S101 to S105, the creation of the circuit diagram data is completed. The processes in steps S101 to S105 are realized by using one design tool, for example. A mask is formed based upon the circuit diagram data created in steps S101 to S105.

(Step S106) A mask for each wiring layer and a mask for a via are formed based upon the circuit diagram data created in steps S101 to S105. The design tool used in steps S101 to S105 and a design/manufacture tool used in step S106 are different from each other, and steps S101 to S105 and step S106 are executed by different operators.

(Step S107) A semiconductor chip formed by using the mask for the wiring layer and the via mask formed in step S106 is verified so as to determine whether the ECO is needed or not. When the ECO is needed, the procedure proceeds to step S108, and when the ECO is not needed, the process is ended. The case in which the ECO is needed is the case where a timing violation is generated as a result of a timing analysis, for example.

(Step S108) The cell in which the wiring is rearranged is determined. Here, a source cell outputting a data signal and a target cell to which the data signal outputted from the source cell is inputted are determined. An output terminal of the source cell is connected to the adjacent spare wiring. For example, the output terminal is connected to the closest spare wiring.

For example, when the source cell 51 and the target cell 52 are determined as illustrated in FIG. 5, the output terminal of the source cell 51 is connected to the M3 spare wiring 301*d* via a wiring 210 as illustrated in FIG. 6. Since the input/output terminal of the cell is provided in the M2 layer, the wiring 210 is provided on the M2 layer, and connected to the M3 spare wiring 301*d* through the via.

(Step S109) The input terminal of the target cell is connected to the adjacent spare wiring. For example, the input terminal of the target cell is connected to the closet spare wiring. In this case, the wiring for connecting the input terminal of the target cell and the spare wiring is provided in the wiring layer same as that for the wiring that connects the output terminal of the source cell and the spare wiring in step S108.

When the wiring 210 illustrated in FIG. 6 is arranged in step S108, for example, a wiring 211 for connecting the input terminal of the target cell 52 and the M3 spare wiring layer 304*a* is arranged in this step as illustrated in FIG. 7. The wiring 211 is provided in the M2 layer, like the wiring 210, and is connected to the M3 spare wiring layer 304*a* through the via.

The order of step S108 and step S109 may be reversed. Specifically, step S108 may be carried out after the execution of step S109.

(Step S110) A path for connecting the source cell and the target cell is required. For example, a path for connecting the spare wiring 301*d* to which the output terminal of the source cell is connected in step S108 and the spare wiring 304*a* to which the input terminal of the target cell is connected in step S109 with the shortest route is demanded. In this case, a free space of the wiring track is considered.

For example, in the example in FIG. 7, a path of the M3 spare wiring 301*d*, the M2 spare wiring 202*a*, the M3 spare wiring 302*c*, the M2 spare wiring 203*b*, the M3 spare wiring 303*b*, the M2 spare wiring 204*c*, and the M3 spare wiring 304*a* is demanded.

(Step S111) Vias are formed in order to realize the path demanded in step S110.

For example, as illustrated in FIG. 8, the via for connecting the M3 spare wiring 301*d* and the M2 spare wiring 202*a*, the via for connecting the M2 spare wiring 202*a* and the M3 spare wiring 302*c*, the via for connecting the M3 spare wiring 302*c* and the M2 spare wiring 203*b*, the via for connecting the M2 spare wiring 203*b* and the M3 spare wiring 303*b*, the via for connecting the M3 spare wiring 303*b* and the M2 spare wiring 204*c*, and the via for connecting the M2 spare wiring 204*c* and the M3 spare wiring 304*a* are arranged.

(Step S112) When a violation of crosstalk noise and a timing violation are generated, the procedure returns to step S110 so as to form another path. When the violation of crosstalk noise and the timing violation are not generated, the procedure proceeds to step S113.

(Step S113) The creating unit 22 corrects the circuit diagram data.

(Step S114) The mask is corrected based upon the circuit diagram data corrected in step S113.

In the above-mentioned steps S101 to S114, steps S101 to S105 and steps S107 to S113 are realized by a single design tool. Specifically, in the process in steps S101 to S105, the circuit diagram data is created by the design tool (design tool according to the present embodiment) employing the design method according to the present embodiment, and thereafter, the mask is formed by another means (step S106). Then, after the formation of the mask, the determination of the ECO and the ECO using the spare wiring are carried out by using the design tool according to the present embodiment in steps S107 to S113. The mask is corrected by another means based upon the circuit diagram data corrected in step S113 by the design tool according to the present embodiment. The correction of the mask in step S114 may be realized by the design tool according to the present embodiment.

As apparent from the example in FIGS. 5 to 8, only the wiring of the M2 layer and the via connecting the M2 layer and the M3 layer are corrected in steps S108 to S111, and the M3 layer is not corrected. Therefore, the mask corresponding to the M3 layer does not have to be corrected, so that the number of the masks to be corrected is decreased, whereby the design period can be shortened.

In steps S108 to S111, only the wiring of the M3 layer and the via connecting the M2 layer and the M3 layer may be corrected, and the M2 layer may not be corrected. For example, as illustrated in FIG. 9, a wiring 310 for connecting the output terminal of the source cell 51 and the M2 spare wiring 202*a*, and a wiring 311 for connecting the input terminal of the target cell 52 and the M2 spare wiring 204*c* are arranged. Since the wirings 310 and 311 are both the wirings in the M3 layer, they are connected to the output terminal of the source cell 51, the M2 spare wiring 202*a*, the input terminal of the target cell 52, and the M2 spare wiring 204*c*, located in the M2 layer, with the vias.

Then, as illustrated in FIG. 9, the via for connecting the M2 spare wiring 202*a* and the M3 spare wiring 302*c*, the via for connecting the M3 spare wiring 302*c* and the M2 spare wiring 203*b*, the via for connecting the M2 spare wiring 203*b* and the M3 spare wiring 303*b*, and the via for connecting the M3 spare wiring 303*b* and the M2 spare wiring 204*c* are arranged. Since the mask corresponding to the M2 layer does not have to be corrected, the number of the masks to be corrected is decreased, whereby the design period can be shortened.

Even when the ECO is needed before the formation of the mask in step S106, the processes same as those in steps S108 to S113 can be executed. Since the spare wirings are arranged before the cell and the signal wiring are arranged in the present embodiment, the spare wirings are in a wide range of the chip, so that they are versatile, and they are ready for various functional corrections. Accordingly, it can be avoided that the layout is re-designed from the beginning, whereby the design period can be shortened. Therefore, in the present embodiment, a design period of the semiconductor integrated circuit can be shortened.

Second Embodiment

A design method of a semiconductor integrated circuit according to a second embodiment of the present invention is different from that in the first embodiment in that the arranging method of the spare wirings is different. The arranging method of the spare wirings in the present embodiment will be described with reference to FIG. 10. In FIG. 10, the parts same as those in FIG. 3 (the view illustrating the arrangement example of the spare wirings according to the first embodiment) are identified by the same numerals, and the description will not be repeated.

As illustrated in FIG. 10, the M2 spare wirings 201 to 204 are arranged so as to be located above power wires 101 to 104 in the M1 layer in the present embodiment. In the M1 layer, the cells (basic cells) 111 to 114 are arranged between the power wires 101 to 104.

Input/output terminals (pins) 121a, b to 124a, b of the cells 111 to 114 are provided in the M2 layer. However, since the M2 spare wirings 201 to 204 are located above the power wires 101 to 104, a short-circuit between the input/output terminals (pins) 121a, 121b to 124a, 124b and the M2 spare wirings 201 to 204 can be prevented.

As described above, according to the present embodiment, the M2 spare wiring is arranged above the power wires, whereby the short-circuit between the input/output terminals of the cell and the spare wirings can be prevented.

Third Embodiment

A design method of a semiconductor integrated circuit according to a third embodiment of the present invention is different from that in the first embodiment in that the arranging method of the spare wirings is different. The arranging method of the spare wirings in the present embodiment will be described with reference to FIG. 11.

Firstly, the spare wirings in the M2 layer will be described.

Figure 11:
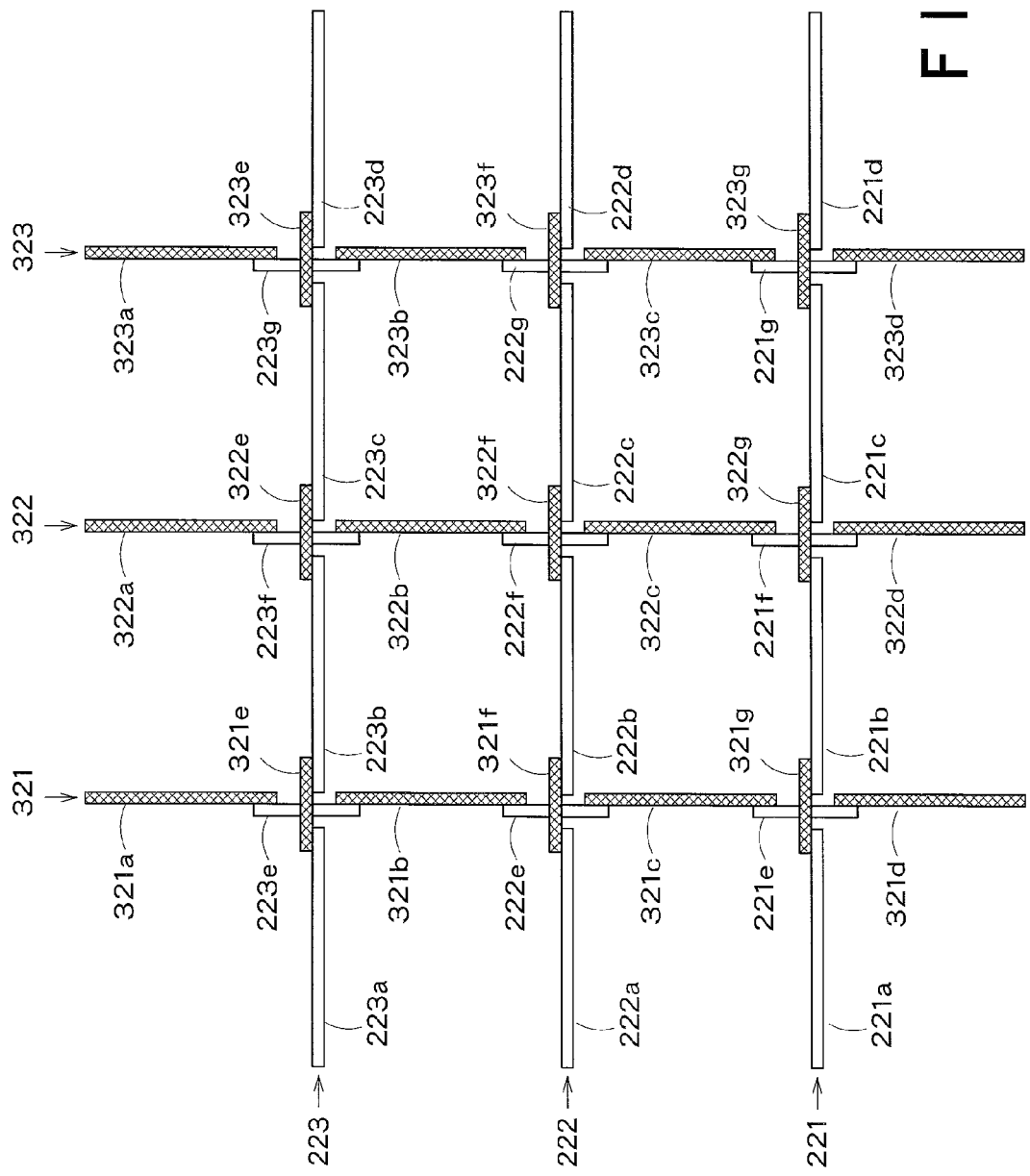
FIG. 11 is a view illustrating a layout example of spare wirings according to a third embodiment.

In the M2 layer, M2 spare wirings 221 to 223 are provided as illustrated in FIG. 11. The M2 spare wiring 221 includes M2 spare wirings 221a to 221d arranged parallel along a first direction (in the lateral direction in the figure) and on the same track (on the same straight line), and M2 spare wirings 221e to 221g parallel along a second direction (in the vertical direction in the figure) orthogonal to the first direction. The M2 spare wirings 221e to 221g are shorter than the M2 spare wirings 221a to 221d.

The M2 spare wiring 221e is arranged between the M2 spare wiring 221a and the M2 spare wiring 221b, and the M2 spare wiring 221e is separated from the M2 spare wiring 221a and the M2 spare wiring 221b.

The M2 spare wiring 221f is arranged between the M2 spare wiring 221b and the M2 spare wiring 221c, and the M2 spare wiring 221f is separated from the M2 spare wiring 221b and the M2 spare wiring 221c.

The M2 spare wiring 221g is arranged between the M2 spare wiring 221c and the M2 spare wiring 221d, and the M2 spare wiring 221g is separated from the M2 spare wiring 221c and the M2 spare wiring 221d.

The M2 spare wirings 222 and 223 have the configuration same as that of the M2 spare wiring 221.

Next, the spare wirings in the M3 layer will be described.

In the M3 layer, M3 spare wirings 321 to 323 are provided as illustrated in FIG. 11. The M3 spare wiring 321 includes M3 spare wirings 321a to 321d arranged parallel along the second direction (in the vertical direction in the figure) and on the same track, and M3 spare wirings 321e to 321g parallel along the first direction (in the lateral direction in the figure).

The M3 spare wiring 321e is arranged between the M3 spare wiring 321a and the M3 spare wiring 321b, and the M3 spare wiring 321e is separated from the M3 spare wiring 321a and the M3 spare wiring 321b.

The M3 spare wiring 321f is arranged between the M3 spare wiring 321b and the M3 spare wiring 321c, and the M3 spare wiring 321f is separated from the M3 spare wiring 321b and the M3 spare wiring 321c.

The M3 spare wiring 321g is arranged between the M3 spare wiring 321c and the M3 spare wiring 321d, and the M3 spare wiring 321g is separated from the M3 spare wiring 321c and the M3 spare wiring 321d.

For example, one end of the M3 spare wiring 321g is located above one end of the M2 spare wiring 221a, and the other end of the M3 spare wiring 321g is located above one end of the M2 spare wiring 221b. One end of the M2 spare wiring 221e is located below one end of the M3 spare wiring 321c, the other end of the M2 spare wiring 221e is located below one end of the M3 spare wiring 321d.

The M3 spare wirings 322 and 323 have the configuration same as that of the M3 spare wiring 321.

Figure 12:
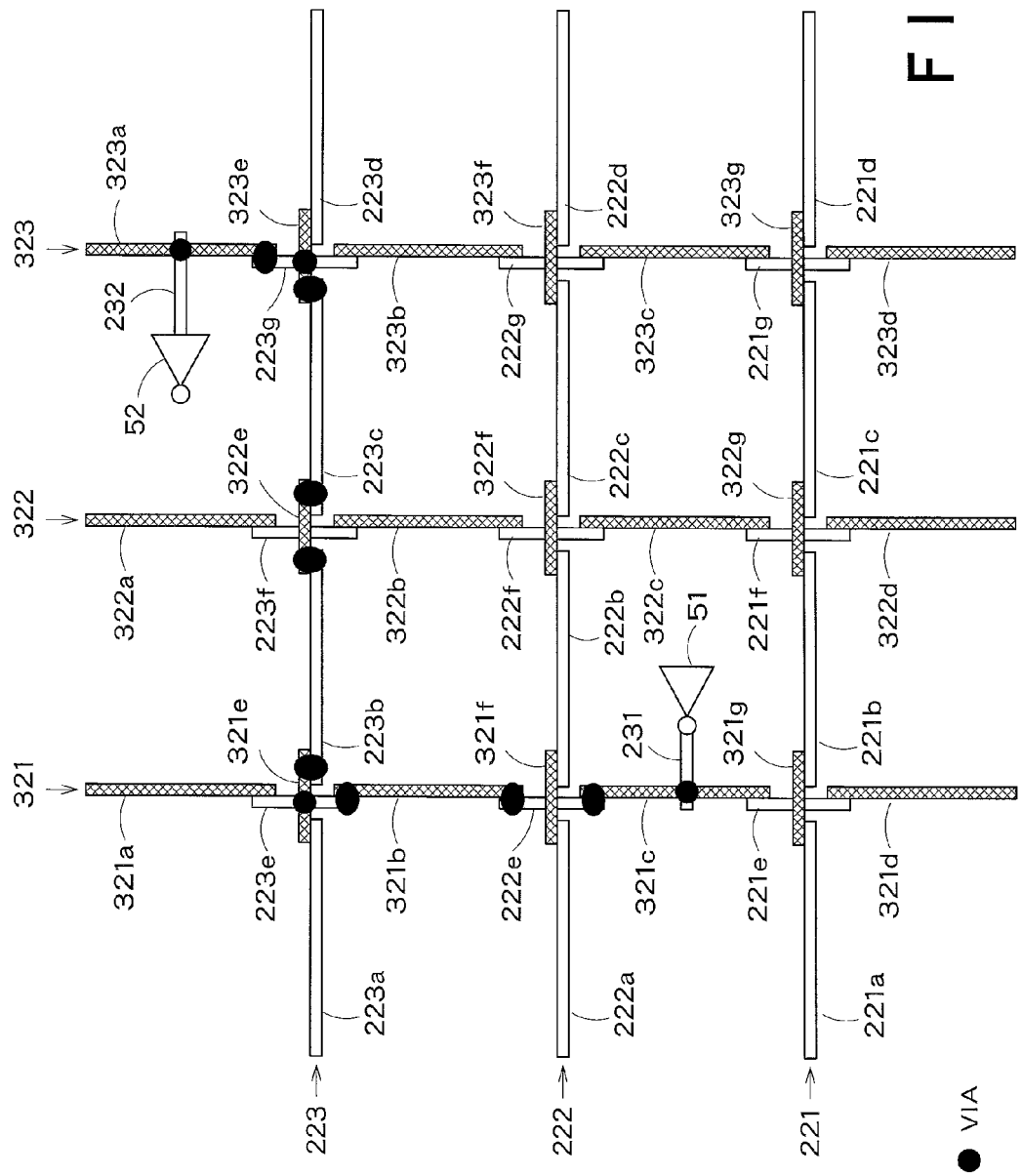
FIG. 12 is a view illustrating one example of an ECO using the spare wirings.

FIG. 12 illustrates an example of rearranging the wirings due to the ECO by using the spare wirings described above. FIG. 12 illustrates an example in which the output terminal of the source cell 51 is connected to the input terminal of the target cell 52.

The output terminal of the source cell 51 is connected to the M3 spare wiring 321c through a wiring 231 in the M2 layer and the via. The input terminal of the target cell 52 is connected to the M3 spare wiring 323a through a wiring 232 in the M2 layer and the via.

One end of the M2 spare wiring 222e is via-connected to the M3 spare wiring 321b, and the other end is via-connected to the M3 spare wiring 321c. One end of the M2 spare wiring 223e is via-connected to the M3 spare wiring 321b, and the central part thereof is via-connected to the central part of the M3 spare wiring 321e. One end of the M3 spare wiring 321e is via-connected to the M2 spare wiring 223b. One end of the M3 spare wiring 322e is via-connected to the M2 spare wiring 223b, and the other end thereof is via-connected to the M2 spare wiring 223c. One end of the M3 spare wiring 323e is via-connected to the M2 spare wiring 223c, and the central part thereof is via-connected to the central part of the M2 spare wiring 223g. One end of the M2 spare wiring 223g is via-connected to the M3 spare wiring 323a.

As described above, during the rearrangement of the wiring due to the ECO, only the wiring of the M2 layer and the via for connecting the M2 layer and the M3 layer are corrected, and the correction of the wiring of the M3 layer is unnecessary. Therefore, when the ECO is performed after the formation of the mask, the number of the masks to be corrected can be decreased.

Like the first embodiment, the spare wirings are arranged before the cells and the signal wirings are arranged. Therefore, the spare wirings are arranged in a wide range of the chip, so that they are versatile, and they are ready for various functional corrections. Accordingly, it can be avoided that the layout is re-designed from the beginning, whereby the design period can be shortened.

Figure 13:
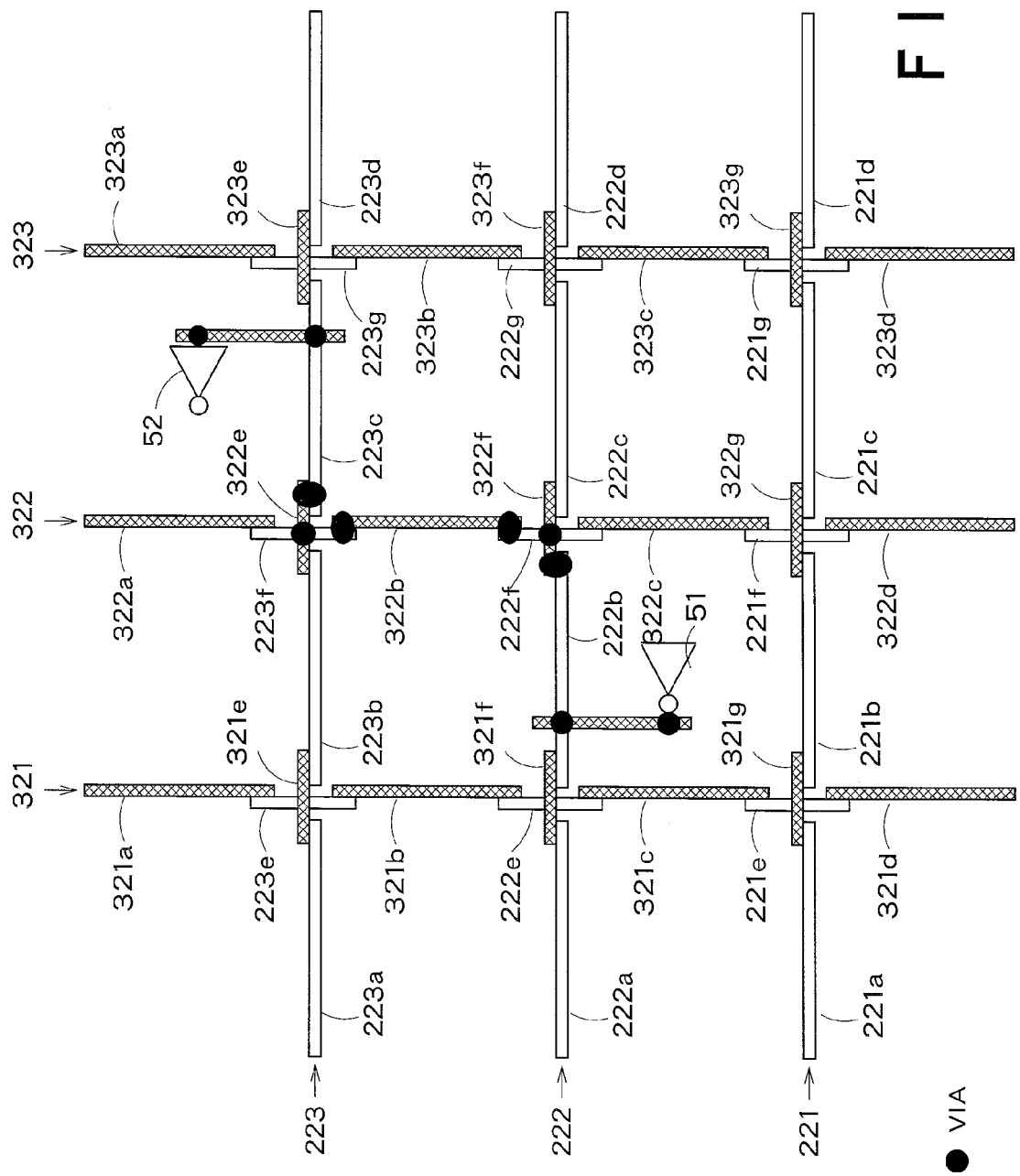
FIG. 13 is a view illustrating one example of an ECO using the spare wirings.

FIG. 12 illustrates the example in which only the wiring of the M2 layer and the via for connecting the M2 layer and the M3 layer are corrected, and the wiring of the M3 layer is not corrected. However, as illustrated in FIG. 13, only the wiring of the M3 layer and the via connecting the M2 layer and the M3 layer may be corrected, and the wiring of the M2 layer may not be corrected.

In FIG. 11, the M2 spare wirings and the M3 spare wirings (e.g., the M2 spare wirings 221a and 221b and the M3 spare wiring 321g) parallel in the first direction (in the lateral direction in the figure) are not overlapped with each other, and they are provided as being shifted from each other. However, they may be provided as being overlapped with each other. Specifically, a part of the M3 spare wiring 321g may be located immediately above the M2 spare wirings 221a and 221b. Similarly, a part of the M3 spare wirings 321c and 321d may be located immediately above the M2 spare wiring 221e.

The present embodiment and the second embodiment may be combined. Specifically, the M2 spare wirings 221 to 223 may be arranged above the power wires of the M1 layer. With this structure, the short-circuit between the M2 spare wirings 221 to 223 and the input/output terminal of the cell can be prevented. It is preferable that the length of the M2 spare wirings 221e to 221g is shorter than the width of the power wire.

Fourth Embodiment

A design method of a semiconductor integrated circuit according to a fourth embodiment of the present invention is different from that in the first embodiment in that the arranging method of the spare wirings is different. The arranging method of the spare wirings in the present embodiment will be described with reference to FIG. 14.

Figure 14:
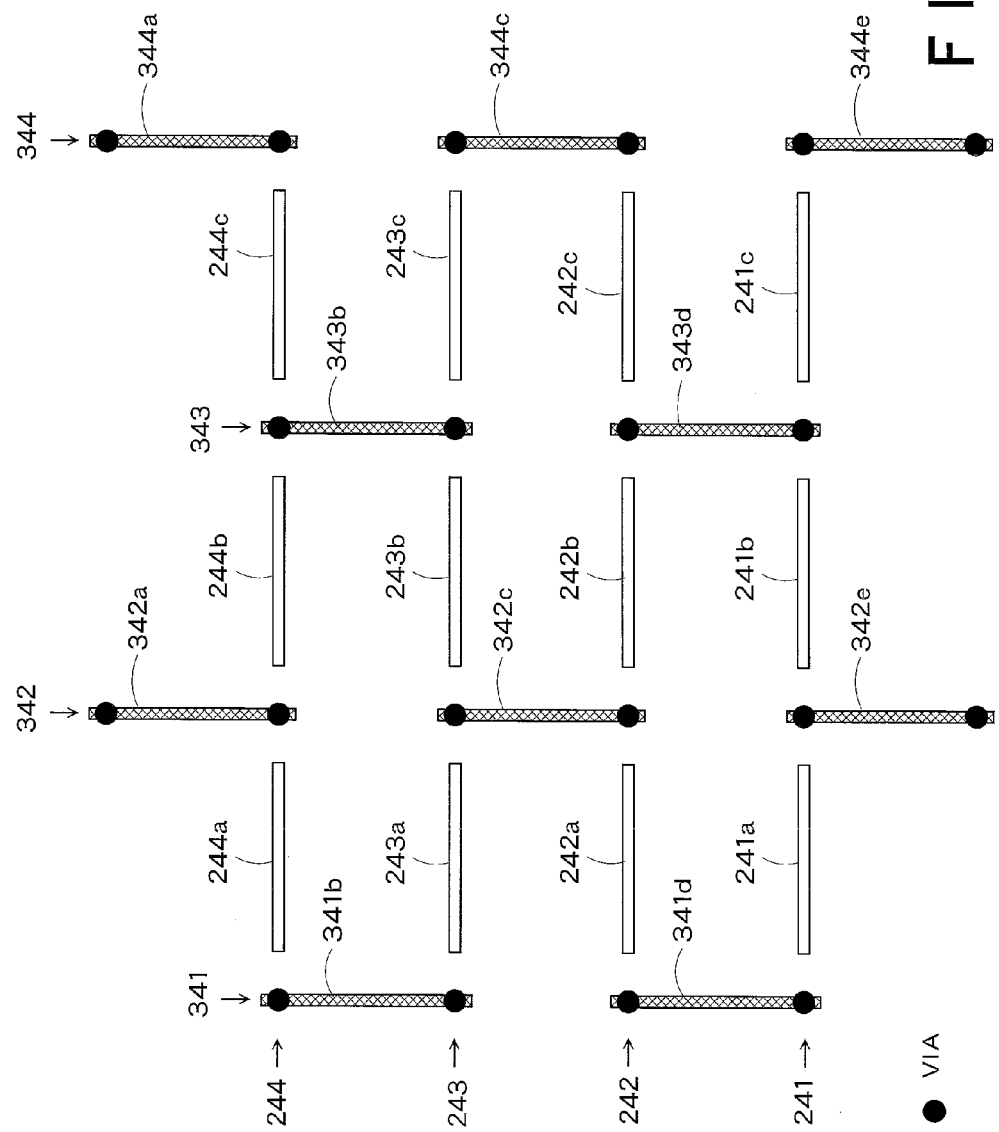
FIG. 14 is a view illustrating a layout example of spare wirings according to a fourth embodiment.

As illustrated in FIG. 14, the M2 spare wirings 241 to 244 are arranged parallel along the first direction (lateral direction in the figure). The M3 spare wirings 341 to 344 are arranged parallel along the second direction (the vertical direction in the figure) orthogonal to the first direction.

Firstly, the M2 spare wirings 241 to 224 will be described.

The M2 spare wiring 241 includes M2 spare wirings 241a, 241b, and 241c arranged on the same straight line, i.e., on the same wiring track. The M2 spare wirings 241a, 241b, and 241c are arranged to have a predetermined space. The M2 spare wirings 242 to 244 have the same configuration.

The distance between the M2 spare wiring 241 and the M2 spare wiring 243 is determined based upon the distance between the power wires provided to the M1 layer. Similarly, the distance between the M2 spare wiring 242 and the M2 spare wiring 243, and the distance between the M2 spare wiring 243 and the M2 spare wiring 244 can also be determined based upon the distance between the power wires provided to the M1 layer.

The M3 spare wirings 341 to 344 will next be described.

The distance between the M3 spare wiring 341 and the M3 spare wiring 342 is slightly longer than the length of the M2 spare wirings 241a, 242a, 243a, and 244a. The distance between the M3 spare wiring 342 and the M3 spare wiring 343 is slightly longer than the length of the M2 spare wirings 241b, 242b, 243b, and 244b. The distance between the M3 spare wiring 343 and the M3 spare wiring 344 is slightly longer than the length of the M2 spare wirings 241c, 242c, 243c, and 244c.

The M3 spare wiring 341 includes M3 spare wirings 341b and 341d arranged on the same wiring track. Vias that can make a connection with the M2 layer are formed on both ends of the M3 spare wirings 341b and 341d.

The M3 spare wiring 342 includes the M3 spare wirings 342a, 342c, and 342e arranged on the same wiring track. Vias that can make a connection with the M2 layer are formed on both ends of the M3 spare wirings 342a, 342c, and 342e. For example, one end of the M3 spare wiring 342c is located above the portion between the M2 spare wiring 242a and the M2 spare wiring 242b, and a via that can make a connection with the M2 layer is formed.

The M3 spare wiring 343 has the configuration same as that of the M3 spare wiring 341, and the M3 spare wiring 344 has the configuration same as that of the M3 spare wiring 342.

Figure 15:
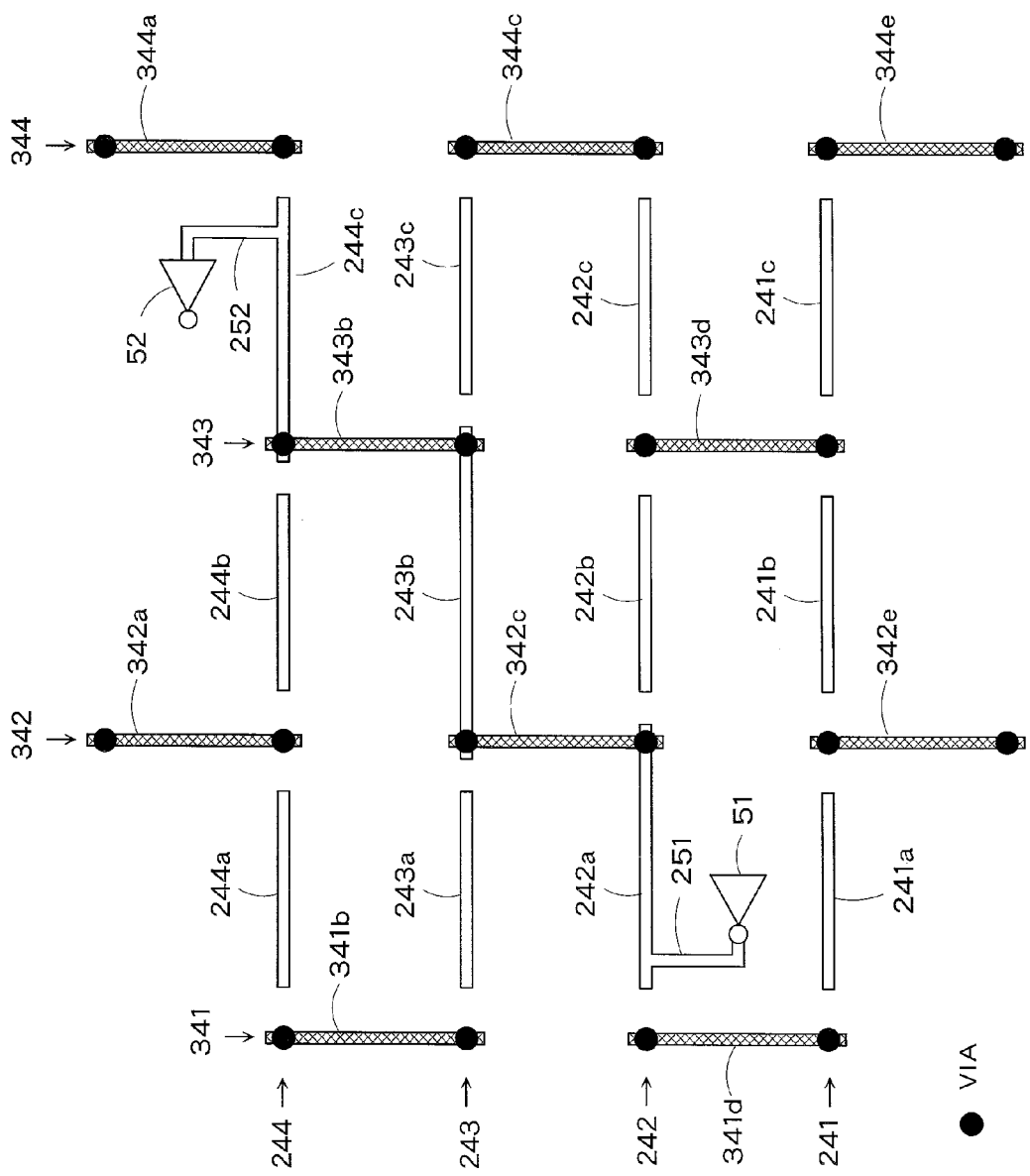
FIG. 15 is a view illustrating one example of an ECO using the spare wirings.

FIG. 15 illustrates an example of rearranging the wirings due to the ECO by using the spare wirings described above. FIG. 15 illustrates the example in which the output terminal of the source cell 51 is connected to the input terminal of the target cell 52.

A wiring 251 of the M2 layer is provided to connect the output terminal of the source cell 51 to the M2 spare wiring 242a. A wiring 252 of the M2 layer is provided to connect the input terminal of the target cell 52 to the M2 spare wiring 244c.

The M2 spare wiring 242a is extended so as to be connected to the via at one end of the M3 spare wiring 342c. The M2 spare wiring 243b is extended to be connected to the via at the other end of the M3 spare wiring 342c and the via at one end of the M3 spare wiring 343b. The M2 spare wiring 244c is extended so as to be connected to the via at the other end of the M3 spare wiring 343b.

As described above, the output terminal of the source cell 51 and the input terminal of the target cell 52 can be connected only by correcting the wiring of the M2 layer.

As described above, during the rearrangement of the wiring due to the ECO, only the wiring of the M2 layer is corrected, and the correction of the via connecting the M2 layer and the M3 layer and the wiring of the M3 layer is unnecessary. Therefore, when the ECO is performed after the formation of the mask, the number of the masks to be corrected can be decreased.

Like the first embodiment, the spare wirings are arranged before the cells and the signal wirings are arranged. Therefore, the spare wirings are arranged in a wide range of the chip, so that they are versatile, and they are ready for various functional corrections. Accordingly, it can be avoided that the layout is re-designed from the beginning, whereby the design period can be shortened.

The present embodiment and the second embodiment described above may be combined. Specifically, the M2 spare wirings 241 to 244 may be arranged above the power wire of the M1 layer. With this structure, the short-circuit between the M2 spare wirings 241 to 244 and the input/output terminal of the cell can be prevented.

In the above-mentioned first to fourth embodiments, the cell is arranged after the spare wirings are arranged. However, the spare wirings may be arranged after the arrangement of the cell. In this case, the density of the spare wirings can be changed; for example, the spare wirings are densely arranged in a region that is highly possibly corrected such as the periphery of a BIST (built in self-test) circuit or a cell that has not yet been verified.

It may be configured such that a design tool program realizing the design method of a semiconductor integrated circuit according to the first to fourth embodiments is stored on a computer connected to the network such as Internet, and the program is provided or distributed through the download via the network. The design tool program may be incorporated into a ROM or the like beforehand so as to be provided. A software development program may be stored in a CD-ROM or an external memory device so as to be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A design method of a semiconductor integrated circuit including a first wiring layer, a second wiring layer formed on the first wiring layer, and a third wiring layer formed on the second wiring layer, the method using a design apparatus, the method comprising:
   arranging plural spare wirings on the second wiring layer along a first direction using the design apparatus, and arranging plural spare wirings on the third wiring layer along a second direction orthogonal to the first direction using the design apparatus;
   arranging cells on the first wiring layer after the arrangement of the spare wirings using the design apparatus;
   arranging a signal wiring using the design apparatus, signal wirings on at least any one of the first to third wiring layers to connect the cells via the signal wiring, and creating circuit diagram data after the arrangement of the cells; and
   performing an engineering change order by replacing at least one of the spare wirings on the second wiring layer or the third wiring layer by signal wirings to connect the cells via the signal wirings, and correcting the circuit diagram data wherein the spare wirings are not used before the engineering change order is performed.

2. The design method of the semiconductor integrated circuit according to claim 1, wherein the spare wirings are arranged such that an end portion of the spare wiring arranged on the third wiring layer is located above the end portion of the spare wiring arranged on the second wiring layer.

3. The design method of the semiconductor integrated circuit according to claim 2, wherein the spare wirings are arranged on the second wiring layer so as to be located above a power wire arranged on the first wiring layer.

4. The design method of the semiconductor integrated circuit according to claim 3, wherein only the wiring of either one of the second wiring layer and the third wiring layer and a via connecting the second wiring layer and the third wiring layer are corrected, when an engineering change order is performed to the wiring.

5. The design method of the semiconductor integrated circuit according to claim 2, further comprising:
   arranging a first spare wiring on a first wiring track of the second wiring layer;
   arranging a second spare wiring on a second wiring track adjacent to the first wiring track in such a manner that one end thereof is adjacent to one end of the first spare wiring; and
   arranging a third spare wiring on the first wiring track in such a manner that one end thereof is adjacent to the other end of the second spare wiring.

6. The design method of the semiconductor integrated circuit according to claim 5, wherein the spare wirings are arranged on the second wiring layer so as to be located above a power wire arranged on the first wiring layer.

7. The design method of the semiconductor integrated circuit according to claim 6, wherein only the wiring of either one of the second wiring layer and the third wiring layer and a via connecting the second wiring layer and the third wiring layer are corrected, when an engineering change order is performed to the wiring.

8. The design method of the semiconductor integrated circuit according to claim 1, wherein,
   on the second wiring layer, a first spare wiring and a second spare wiring are arranged to have a predetermined space on a same straight line along the first direction, and a third spare wiring that is shorter than the second spare wiring is arranged between the first spare wiring and the second spare wiring along the second direction, and
   on the third wiring layer, a fourth spare wiring and a fifth spare wiring are arranged to have a predetermined space on the same straight line along the second direction, and a sixth spare wiring that is shorter than the fourth spare wiring and the fifth spare wiring is arranged between the fourth spare wiring and the fifth spare wiring along the first direction, wherein
   one end of the third spare wiring is located below one end of the fourth spare wiring, the other end of the third spare wiring is located below one end of the fifth spare wiring, one end of the sixth spare wiring is located above one end of the first spare wiring, and the other end of the sixth spare wiring is located above one end of the second spare wiring.

9. The design method of the semiconductor integrated circuit according to claim 8, wherein the spare wirings are arranged on the second wiring layer so as to be located above a power wire arranged on the first wiring layer.

10. The design method of the semiconductor integrated circuit according to claim 9, wherein only the wiring of either one of the second wiring layer and the third wiring layer and a via connecting the second wiring layer and the third wiring layer are corrected, when an engineering change order is performed to the wiring.

11. The design method of the semiconductor integrated circuit according to claim 1, wherein
   on the second wiring layer, a first spare wiring and a second spare wiring are arranged to have a predetermined space on a same straight line along the first direction, and
   on the third wiring layer, a third spare wiring is arranged in such a manner that one end thereof is located above a portion between the first spare wiring and the second spare wiring, and a via that connects one end of the third spare wiring and the second wiring layer is formed.

12. The design method of the semiconductor integrated circuit according to claim 11, wherein the spare wirings are arranged on the second wiring layer so as to be located above a power wire arranged on the first wiring layer.

13. The design method of the semiconductor integrated circuit according to claim 12, wherein only the wiring of either one of the second wiring layer and the third wiring layer is corrected, when an engineering change order is performed to the wiring.

14. A non-transitory computer readable medium for design of a semiconductor integrated circuit including a first wiring layer, a second wiring layer formed on the first wiring layer, and a third wiring layer formed on the second wiring layer, the medium comprising instructions that cause a computer to:

arranging plural spare wirings on the second wiring layer along a first direction, and arranging plural spare wirings on the third wiring layer along a second direction orthogonal to the first direction;

arranging cells on the first wiring layer after the arrangement of the spare wirings;

arranging signal wirings on at least any one of the first to third wiring layers to connect the cells via the signal wiring and creating circuit diagram data after the arrangement of the cells; and performing an engineering change order replacing at least one of the spare wirings on the second wiring layer or the third wiring layer by signal wirings to connect the cells via the signal wirings, and correcting the circuit diagram data wherein the spare wirings are not used before the engineering change order is performed.

* * * * *